United States Patent
Brown et al.

[11] Patent Number: 5,891,978
[45] Date of Patent: Apr. 6, 1999

[54] ROOM TEMPERATURE CURABLE COMPOSITIONS

[75] Inventors: Scott S. D. Brown, Vale of Glamorgan, United Kingdom; Patrick J. Merlin, Rue Caulier, Belgium; Richard G. Taylor, Barry, United Kingdom

[73] Assignee: Dow Corning, Ltd., Barry, United Kingdom

[21] Appl. No.: 856,709

[22] Filed: May 15, 1997

[30] Foreign Application Priority Data

May 30, 1996 [GB] United Kingdom ............... 9611291

[51] Int. Cl.⁶ .................................................. C08G 77/06
[52] U.S. Cl. ........................................... 528/17; 525/477
[58] Field of Search .............................. 528/17; 525/477

[56] References Cited

U.S. PATENT DOCUMENTS

| | | | |
|---|---|---|---|
| 4,525,565 | 6/1985 | Laisney et al. | 528/17 |
| 5,208,300 | 5/1993 | Krahnke et al. | 525/474 |
| 5,473,026 | 12/1995 | Strong et al. | 525/477 |
| 5,767,217 | 6/1998 | Choukroun et al. | 528/17 |

*Primary Examiner*—Robert Dawson
*Assistant Examiner*—Caixia Lu-Rutt
*Attorney, Agent, or Firm*—Patricia M. Scaduto

[57] ABSTRACT

A curable composition which comprises (A) an organosilicon compound having at least one silicon-bonded alkoxy group per molecule and on average at least three hydroxyl and/or alkoxy groups bonded to silicon per molecule; (B) a catalyst component characterized in that the catalyst component is according to the formula

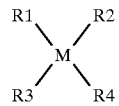

wherein $R^1$ and $R^2$ each independently represent a pentahapto ligand, $R^3$ represents a fluoroaromatic ligand having a fluorine atom bonded in the ortho position relative to the M-ligand bond, $R^4$ represents a group $R^3$ or a monovalent alkyl, alkenyl, alkoxy, alkoxy alkoxy, halogen, aryl, halo substituted aryl, organosilicon or organosiloxane group and M represents Ti, Zr or Hf, which is curable by exposure by UV radiation; and optionally (C) an organo-silicon having two of silicon-bonded hydroxyl or alkoxy groups per molecule, wherein the organo-silicone is selected from the group consisting of organopolysiloxane and organosilicon-organic copolymer.

23 Claims, No Drawings

ROOM TEMPERATURE CURABLE COMPOSITIONS

This invention relates to room temperature curable compositions, in particular, room temperature curable compositions which cure upon exposure to UV or visible light.

Room temperature curable compositions are known which comprise alkoxy end-blocked organosilicon polymers and an organotitanate catalyst. These compositions are stable in the absence of moisture, but cure in the presence of moisture to elastomeric materials.

Compositions of this type display a tendency to deactivate during storage over a period of time, that is, they lose the ability to cure. Whilst the applicant does not wish to be bound by any theory, this deactivation is believed to be the result of the tendency of the organo-titanate catalyst to cleave the alkoxysilyl end-groups of the polymer in the presence of residual moisture. This is particularly undesirable because a composition can be expelled from its container into its desired location, for example into a cavity for sealing purpose without the user being aware that anything is wrong. It is only after the composition fails to cure that the problem becomes apparent. It would therefore necessitate the removal of the uncured material from the site of its application.

There is a need to provide curable compositions based on alkoxy-functional siloxane materials and organotitanium catalysts which are storage stable with respect to moisture and which do not deactivate during storage, yet cure rapidly at ambient temperature to provide elastomeric materials having low modulus and which additionally adhere well to a variety of substrates.

We have now found that an improved composition can be provided which comprises an organosilicon compound having at least one silicon-bonded alkoxy group per molecule and on average at least three silanol groups and/or silicon-bonded alkoxy groups per molecule and an organotitanium catalyst, which is composition curable by a moisture-activated condensation reaction of the organosilicon compound, the composition being stable even in the presence of moisture until such time as it is exposed to UV/visible light in a certain wavelength range.

According to the invention there is provided a curable composition comprising (A) an organosilicon compound having at least one silicon-bonded alkoxy group per molecule and on average of at least three hydroxyl and/or alkoxy groups bonded to silicon per molecule and (B) a catalyst component according to the formula (I)

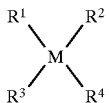  (I)

wherein $R^1$ and $R^2$ each independently represent a pentahapto ligand, $R^3$ represents a fluoro-aromatic ligand having a fluorine atom bonded in the ortho position relative to the M-ligand bond, $R^4$ represents a group $R^1$ or a monovalent alkyl, alkenyl, alkoxy, alkoxyalkoxy, halogen, aryl, halo-substituted aryl, organosilicon or organosiloxane group and M represents Ti, Zr or Hf.

The organosilicon compound (A) having at least one silicon-bonded alkoxy group per molecule and on average at least three hydroxyl and/or alkoxy groups bonded to silicon per molecule may be a silane, an organopolysiloxane or an organosilicon-organic copolymer, the organic component of which may be for example, a polyolefin, a polyester, a polyamide or a polyether or may be a mixture of two or more of these. Where the organosilicon compound (A) is polymeric, it may be linear or branched and preferably has a viscosity of from $10^2$ Pa.s. to $10^2$ Pa.s. at 25° C. Any material suitable as component (A) may be used alone or as a mixture of two or more of them. Preferred component (A) is an organopolysiloxane having at least one unit according to the general formula (II) $R^5{}_a(X)_b SiO_{(4-a-b)/2}$, any remaining units of the organopolysiloxane being according to the formula (III) $R^5{}_n SiO_{(4-e)/2}$ or may be a silane according to the formula (IV) $R^5{}_c(Y)_d Si$ wherein a has a value 0, 1 or 2, b has a value 1, 2 or 3, provided that a+b is not greater than 3, c has a value 0 or 1, d has a value 3 or 4 provided that c+d equals 4, e has a value 0, 1, 2 or 3, Y represents a hydroxyl, alkoxy or alkoxyalkoxy group and X represents a group Y or a group —$(CH_2)_2,(Me_2SiO)$ $(Me_2Si)$ $(CH_2)_2Si(OMe)_3$ wherein Me is a methyl group and $R^5$ represents a monovalent group which does not inhibit or compete with the condensation reaction of component (A), for example, a hydrocarbon or substituted hydrocarbon group having 1 to 12 carbon atoms, e.g. a saturated hydrocarbon group, for example methyl, isopropyl, hexyl or dodecyl, a saturated substituted hydrocarbon group, for example, haloalkyl or aminoalkyl, an unsaturated hydrocarbon group, for example, vinyl, allyl, hexenyl or phenyl and where there is at least one silicon-bonded alkoxy group per molecule. A more preferred component (A) is an organopolysiloxane according to the formula $HOSiR^5{}_2$—$[OSiR^5{}_2]_m$—$[OSiR^5(OR^6)]_n$—$[OSi(OR^6)_2]_p$—$OSiR^5{}_2OH$ wherein $R_6$ is selected from a hydrogen atom and a lower alkyl group e.g., a methyl group, m is from 0 to 1000, a is from 0 to 100, p is from 0 to 100 and the value of m, n and p is such that the viscosity of the more preferred organopolysiloxane is from $10^{-2}$ Pa.s. to $10^2$ Pa.s at 25° C., most preferably 1 Pa.s and wherein there is at least one $OR°$ group per molecule wherein $R^6$ is alkyl, Catalyst compound (B) of a curable composition according to the invention is preferably a material represented by the formula (V)

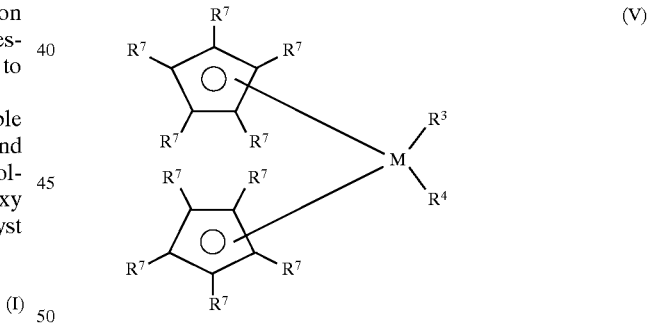  (V)

wherein each $R^7$ is independently a hydrogen atom, a saturated, unsaturated aliphatic or aromatic hydrocarbon having up to 18, preferably up to 6 carbon atoms, or a silyl group of the formula $SiR^8{}_2R^9$, wherein $R^8$ is an alkyl group having up to 18, preferably up to 6 carbon atoms e.g., methyl, ethyl or propyl and $R^9$ is a group $R^8$, an unsaturated monovalent hydrocarbon, e.g., vinyl, allyl or hexenyl or a hydrocarbon substituted with an organosiloxane group, wherein 2 or more $R^7$ groups together form one or more cyclic links back to the cyclopentadienyl ring, thus forming with the cyclopentadienyl ring a fused carbocyclic ring, e.g. tetrahydroindenyl, a fused aromatic carbocyclic ring e.g., indenyl, a fused aromatic polycyclic ring, e.g., fluorenyl, or any of the fused rings recited above substituted with, for example, an alkyl group having 1 to 8 carbon atoms, a silyl group $SiR^8{}_7R^9$ or wherein two $R^7$ groups substituted on different cyclopentadienyl rings (i.e. $R^1$ and $R^2$) form a divalent linkage between the two cyclopentadienyl rings, e.g. a divalent dialkyl silyl group, alkylene group, substituted alkylene group, substituted siloxane group, carbosilylene group or substituted disilyl group. M is preferably a titanium atom.

Compounds according to the formula (V) are known in the art and in the following description shall be referred to as metallocene analogues and the preferred materials containing a titanium atom shall be referred to as titanocene analogues. These compounds are characterised by the two pentahapto, or five-electron, ligands complexed to the central metal atom. Metallocene analogues used in the present invention may vary in their physical forms from solid crystalline materials to viscous oils. Preferred metallocene analogues of a composition according to the invention are crystalline solids.

The fluoroaromatic ligand $R^3$ of catalyst compound (B) may be, for example, an aromatic carbocyclic or heterocyclic ring system substituted at a ortho position relative to the metal-carbon bond with a fluorine atom and may be represented by the formula (VI)

(VI)

wherein each $R^{10}$ independently represents a hydrogen atom, a halogen atom, e.g., fluorine chlorine, bromine an alkyl group having 1 to 18, preferably 1 to 8 carbon atoms, e.g., methyl, ethyl, propyl, a haloalkyl group having 1 to 18, preferably 1 to 8 carbon atoms, e.g. chloromethyl, an unsaturated hydrocarbon, preferably having from 1 to 6 carbon atoms, e.g., vinyl, allyl or hexenyl, a silyl group $SiR^8_2R^9$ as defined above, an aromatic or hetero-aromatic ring optionally substituted with a halogen atom, an alkyl group having 1 to 18 carbon atoms, an alkenyl group or a silyl group $SiR^8_2R^9$, the aromatic or heteroaromatic ring, when present preferably being bonded to the fluoro-aromatic ligand with a single bond in the para position relative to the M-ligand bond, e.g., as in a biphenyl ring assembly or wherein two or more of the $R^{10}$ groups form one or more cyclic links back to the fluoroaromatic $C_6$ ring, thus forming with the aromatic $C_6$ ring a fused aromatic carbocyclic ring, a fused aromatic polycyclic ring, a fused polyaromatic ring, or any of the fused rings recited above substituted with, for example, an alkyl group having 1 to 8 carbon atoms. A preferred fluoro-aromatic ligand (VI) is the pentafluorophenyl group.

The group $R^4$ may be a group $R^3$ or an alkyl group having 1 to 18, preferably 1 to 12 carbon atoms, an alkoxy group having 1 to 18, preferably 1 to 8 carbon atoms, an alkenyl group having 1 to 18, preferably 1 to 6 carbon atoms, e.g., vinyl, allyl or hexenyl, an alkoxy alkoxy group, a halogen atom, an aryl group, a halo substituted aryl group or a monovalent organosilicon or organosiloxane group, e.g. a silyl group $SiR^8_2R^9$ as referred to above. Preferred catalyst compounds are chose metallocene analogues, more preferably titanocene analogues in which $R^3=R^4=$ortho disubstituted fluorophenyl, most preferably pentafluorophenyl ligands.

Alternatively, $R^3$ and $R^4$ may together represent the bidentate ligand (VII)

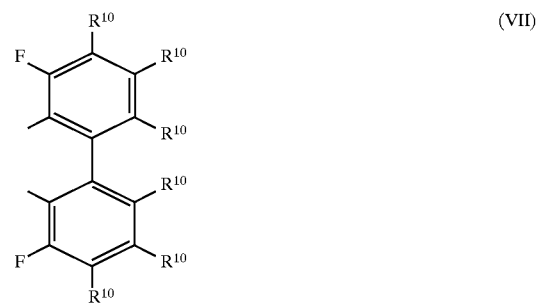
(VII)

The titanocene analogues of this invention can be conveniently prepared from the corresponding titanocene dichloride of formula (VIII),

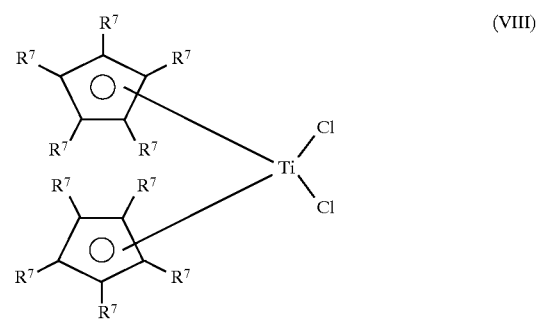
(VIII)

some of which are commercially available, and which can be prepared e.g. from $TiCl_4$ and the corresponding metallic salt of the substituted cyclopentadiene molecule.

The Ti-$R^3$ and Ti-$R^4$ bonds can be prepared by any suitable synthesis. A titanium to carbon linkage may be formed, for example, by reacting a mole of titanocene dichloride or a titanocene dichloride analogue with at least a mole of a suitable organometallic reagent, e.g. alkyl lithium, aryl lithium or organomagnesium in an inert solvent, for example, tetrahydrofuran or diethyl ether.

By selecting the solvent carefully, one can influence the synthesis to favour the mono-substitution (replacing one titanium-bonded chlorine atom) or the di-substitution (i.e. replacing both titanium-bonded chlorine atoms). For example the use of ethylene glycol dimethyl ether will favour the formation of the monosubstituted product, whereas the use of diethyl ether will favour the formation of the di-substituted material.

Where $R^3$ and $R^4$ are different, the titanocene or titanocene analogue can be prepared by the sequential addition of 1 mole of the desired organolithium reagents to 1 mole of titanocene dichloride.

A titanium to oxygen linkage may be formed, for example, by reacting a mole of titanocene dichloride or a titanocene dichloride analogue with at least a mole of a suitable metal salt of a hydroxylated organic or silicon based compound, e.g. alkoxides or siloxides, for example, a sodium or lithium alkoxide, $KOSiR_3$ wherein R denotes an alkyl group or a siloxane polymer having a siloxide end-group present, e.g. $Me(Me_2SiO)_cMe_2SiOZ$, where t is an integer having a value of from 2 to 500, and Z is K, Na or Li, in an inert solvent, e.g., tetrahydrofuran or diethyl ether.

A curable composition according to the invention may additionally comprise an organosilicon compound having two silicon-bonded hydroxyl or alkoxy groups per molecule (C). This organosilicon compound may be an organopolysiloxane or an organosilicon-organic copolymer, the organic component of which may be e.g. polyolefin, polyester, polyamide or polyether. The materials useful as component (C) may be linear or branched polymers and may have a viscosity of the order of $10^2$ Pa.s. to $10^2$ Pa.s. at 25° C. The materials useful as component (C) may be used alone or they may be used as a mixture of two or more of them. A preferred component (C) is a silanol terminated polydiorganosiloxane having the general formula HO-SiR$^5_2$[OSiR$^b_2$]$_r$—OH, wherein r is from 1 to 1000 such that the polydiorganosiloxane has a viscosity of from $10^2$ Pa.s. to $10^2$ Pa.s. at 25° C., preferably 0.1 to 10 Pa.s.

The catalyst component (B) of a composition according to the invention may be present in an amount of from 0.1 part to 10 parts by weight and preferably from 2 parts to 5 parts by weight per 100 parts of the total organosilicon compounds (A) and (C).

If desired other adjuvants may be incorporated into curable compositions according to the invention, for example fillers, adhesion promoters, dyes, plasticisers and pigments. Reinforcing or extending fillers may be selected from titania, silica, sodium carbonate, carbon black or other well known fillers, having a particle size of from $10^{-4}$ μm to 10 μm and may be employed in pro-portions of from 0 to 100 parts by weight per 100 parts of the total of compounds (A) and (C) combined.

Compositions according to the invention may be formed of one or more parts. Typically, preferred compositions are formed as one-part compositions although one may wish to formulate a two-part composition in order to store the organosilicon compounds (A) and/or (C) separately from the catalyst. No special precaution need be taken to isolate the composition from atmospheric moisture, although care should be taken to ensure that prior to use, the composition is not exposed to light sources of a wavelength in the range of from 200 to 700 nm, especially 350 to 500 nm.

When exposed to visible light of a wavelength of 350 to 500 nm the composition will cure rapidly to an elastomeric state to provide an elastomeric material having low modulus and which adheres well to a variety of substrates. The Applicant believes, although does not wish to be bound by any theory, that the metallocene analogues dissociate to generate highly reactive metal (II) complexes when exposed to light of wavelength of from 350 to 500 nm. The metal (II) complexes are highly sensitive to residual moisture in the composition and will react with this moisture to form species which catalyst the condensation reaction of the organosilicon compound or compounds.

This invention offers compositions which have good shelf stability and preferred compositions can be stored in the absence of light of a wavelength range of from 200 to 700 nm for up to 12 months without curing. In the event that shelf stability of a composition should fail, for example, as a result of the composition becoming exposed to light of the above mentioned wavelength, the failure will be apparent to an operator as the composition will thicken or completely cure within its container.

The organosilicon compound and catalyst selected for the composition according to the invention enable controlled cure of a composition when required, by activating the catalyst with UV/visible light. Cure is rapid, for example, a composition in thin section e.g. 10 to 50 μm will cure within 1 to 3 minutes upon exposure to radiation with a wavelength of 350 to 500 nm when in the presence of moisture, e.g., atmospheric moisture or residual, occluded moisture.

Accordingly, in another aspect of the invention there is provided a method of curing a curable composition according to the invention by exposing said curable composition to radiation of 350 nm to 500 nm in the presence of moisture.

Furthermore, selection of materials as the organo-silicon compounds (A) and (C) which have silicon-bonded hydroxyl groups provides that a condensation reaction by-product is water, thus the process of curing generates its own moisture throughout the bulk of the composition which obviates the need for moisture to permeate throughout the composition to effect cure. It is, therefore, possible for thick sections, e.g., 1 to 2 centimeters of said compositions to cure relatively quickly, i.e. within 2 to 4 hours in bright daylight.

The curable compositions according to the invention are usefully employed in a variety of applications for example as coating, caulking or encapsulating materials. They are, however, particularly suitable as conformal coatings applied, for example, to electronic circuit boards and other substrates where heat cure is likely to damage sensitive components.

There now follows a number of examples which illustrate the invention. The source of UV/visible radiation was a mercury lamp utilising a V-bulb with maximum emission of about 410–420 nm. The irradiation source was placed at a distance of 10 cm from test samples. All parts are expressed by weight and all viscosities were measured in Pa.s, at 25° C. Me denotes a methyl group.

EXAMPLE 1

A first polymer catalyst dispersion was formed according to the following procedure: a first polydimethylsiloxane, having a viscosity of 47 Pa.s. and having end-blocking groups $(CH_2)_2(Me_2SiO)(Me_2Si)(CH_2)_2Si(OMe)_3$ connected to the polydimethylsiloxane chain by a siliconcarbon linkage (5.0 g) was milled on a Pascall® 7535 roll mill. As catalyst, bis (pentafluorophenyl) titanocene $(Cp_2Ti(C_6F_5)_2)$ where Cp is a cyclopentadienyl ring (500 mg) was added to the first polydimethyl siloxane and the resultant composition was milled until the catalyst was homogeneously dispersed therein. After removal of the first dispersion from the mill, a further 5.0 g portion of the first polydimethyl siloxane polymer was added to the mill in order to flush out any remaining catalyst which was then combined with the first polymer-catalyst dispersion. The resultant composition was a masterbatch of siloxane polymer with 5% by weight of titanocene catalyst.

Portions of the masterbatch were pipetted onto glass slides and smoothed across the slides with a spatula to provide a coating of approximately 20 μm thickness. The coated slides were placed in glass containers under controlled atmospheres and irradiated with a V-bulb. The results are shown in Table I.

TABLE I

Influence of irradiation conditions on cure rate.
Cure Rate (in seconds) in atmosphere of:

| Air | N$_2$ Dry | Air + Moisture | Air + P$_2$O$_5$ |
|---|---|---|---|
| 90 | >360 | 90 | 360 |

The results illustrate that the cure of the composition is inhibited in a dry atmosphere.

EXAMPLE 2

A second master batch of 10.0 parts of a silanol terminated linear polydimethylsiloxane having a viscosity of 20 Pa.s., and 0.5 part of the catalyst of Example 1 (5% by weight) was prepared according to the method of Example 1. 10 g of tetraethoxysilane crosslinker, (10% by weight)

was added to 100 g of the second masterbatch and was milled on a Pascal® 7535 roll mill to ensure a second homogeneous dispersion. Portions of the second dispersion were diluted with the silanol terminated linear polydimethylsiloxane used to make the second masterbatch to form compositions having respectively 2.5% and 1.25% by weight of the catalyst.

The compositions were coated onto glass slides by the method according to Example 1 to provide coatings of approximately 20 µm which were irradiated in ambient atmosphere. The results are shown in Table II.

TABLE II

Effect of catalyst concentration (% by weight) upon the cure rate of thin coatings.

| Catalyst loading | 5.0 | 2.5 | 1.25 |
|---|---|---|---|
| Cure Rate (seconds) | 60[a] | 60[a] | 120[b] |

[a] = Cured coating with orange peel surface
[b] = Cured coating which is slightly soft and rubbery

COMPARATIVE EXAMPLE 1

Tetra-isopropyl titanate catalyst, 200 mg (2% by weight) was added to a tri-isopropoxy silyl terminated polydimethylsiloxane having a viscosity of 40 Pa.s. The mixture was milled on a Pascall® 7535 roll mill to ensure homogeneous dispersion of the catalyst within the polymer. Portions of the resultant composition were independently coated onto a glass slide according to the method of Example 1 to a thickness of 10–20 µm (C1); pipetted into a glass vial to a depth of 1 mm, (C2) and pipetted into a glass vial to a depth of 1 mm, (C3). The samples were allowed to cure in ambient atmosphere. The results are shown in Table III.

TABLE III

Effect of sample thickness on cure time.

| | C1 | C2 | C3 |
|---|---|---|---|
| Cure Time | 15 h[a] | 15 h[a] | —[b] |

[a] = Partial cure
[b] = Skin cure only, no cure in bulk

That which is claimed is:

1. A curable composition comprising (A) an organosilicon compound having in each molecule at least one silicon-bonded alkoxy group and on average at least three groups selected from the group consisting of hydroxyl and alkoxy groups each bonded to a silicon atom; and (B) a catalyst component according to the formula

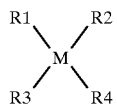

wherein $R^1$ and $R^2$ each independently is a pentahapto ligand, $R^3$ is a fluoroaromatic ligand having a fluorine atom bonded in the ortho position relative to the M-ligand bond, $R^4$ is a group selected from the group consisting of $R^3$, monovalent alkyl, alkenyl, alkoxy, alkoxy alkoxy, halogen, aryl, halo substituted aryl, organosilicon and organosiloxane groups, and M is an atom selected from the group consisting of Ti, Zr and Hf.

2. A curable composition according to claim 1, wherein the organosilicon compound (A) comprises a compound selected from the group consisting of silane, an organopolysiloxane and an organosilicon-organic copolymer, the organic component of which is selected from the group consisting of polyolefin, polyester, polyamide and polyether.

3. A curable composition according to claim 1, wherein the organosilicon compound (A) is polymeric and has a viscosity of from $10^{-2}$ Pa.s. to $10^2$ Pa.s. at 25° C.

4. A curable composition according to claim 1, wherein component (A) comprises an organopolysiloxane having at least one unit according to the general formula (II) $R^5_a(X)_bSiO_{(4-a-b)/2}$, any remaining units of the organopolysiloxane being according to the formula (III) $R^5_eSiO_{(4-e)/2}$, wherein a is 0, 1 or 2, k is an integer from 1 to 3, provided that a+b is not greater than 3, e is 0, 1, 2 or 3, X is a group selected from the group consisting of hydroxyl, alkoxy, alkoxy-alkoxy and groups of the formula —(CH$_2$)$_2$(Me$_2$SiO)(Me$_2$Si)(CH$_2$)$_2$Si(OMe)$_3$ wherein Me is a methyl group, and $R^5$ is a monovalent group which does not inhibit or compete with the condensation reaction of component (A).

5. A curable composition according to claim 1, wherein component (A) comprises a silane according to the formula (IV) $R^5_c(Y)_dSi$ wherein c is 0 or 1, d is 3 or 4 provided that c+d equals 4, and Y is a group selected from the group consisting of hydroxyl, alkoxy and alknoxyalkoxy groups.

6. A curable composition according to claim 1, wherein component (A) is an organopolysiloxane according to the formula HOSiR$^5_2$—[OSiR$^5_2$]$_m$—[OSiR$^5$(OR$^6$)]$_n$—[OSi(OR$^6$)$_2$]$_p$—OSiR$^5_2$OH wherein R$_5$ is a monovalent group which does not inhibit or compete with the condensation reaction of component (A), $R^6$ is selected from the group consisting of hydrogen atoms and lower alkyl groups, m has a value of from 0 to 1000, n has a value of from 0 to 100, p has a value of from 0 to 100 and the value of m, n and p is such that the viscosity is from $10^{-2}$ Pa.s. to $10^2$ Pa-s at 25° C.

7. A curable composition according to claim 1, wherein $R^1$ and $R^2$ are both cyclopentadienyl rings as represented in the compound (B) formula

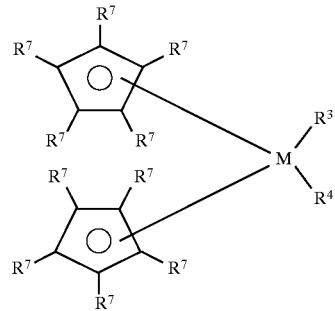

wherein each $R^7$ is independently selected from the group consisting of hydrogen atoms, saturated and unsaturated aliphatic or aromatic hydrocarbon groups having up to 18 carbon atoms, and silyl groups of the formula SiR$^8_2$R$^9$, wherein $R^8$ is an alkyl group having up to 18 carbon atoms and $R^9$ is selected from the group consisting of $R^8$, unsaturated monovalent hydrocarbon and hydrocarbon groups substituted by organosiloxane groups.

8. A curable composition according to claim 7 wherein at least two $R^7$ groups on the same cyclopentadienyl ring together form at least one cyclic link back to said cyclopentadienyl ring, thus forming with the cyclopentadienyl ring a cyclopentadienyl containing ring system selected from the group consisting of a fused carbocyclic ring, a fused aromatic carbocyclic ring, a fused aromatic polycylic ring and any of the fused rings recited above substituted with a group selected from the group consisting of an alkyl group having 1 to 8 carbon atoms and a silyl group $SiR^8{}_2R^9$.

9. A curable composition according to claim 7 wherein two $R^7$ groups substituted on different cyclopentadienyl rings together form a divalent linkage between said different cyclopentadienyl rings.

10. A curable composition according to claim 1, wherein M is a titanium atom.

11. A curable composition according to claim 7, wherein $R^3$ of catalyst compound (B) is a fluoroaromatic ligand selected from the group consisting of aromatic carbocyclic and heterocyclic ring systems substituted at an ortho position relative to the metal-carbon bond with a fluorine atom, represented by the formula

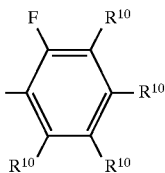

wherein each $R^{10}$ independently is a group selected from the group consisting of a hydrogen atom, a halogen atom, an alkyl group having 1 to 18 carbon atoms, a haloalkyl group having 1 to 18 carbon atoms, an unsaturated hydrocarbon, a silyl group $SiR^8{}_2R^9$, an aromatic ring optionally substituted with a halogen atom, a hetero-aromatic ring optionally substituted with a halogen atom, an alkyl group having 1 to 18 carbon atoms, an alkenyl group and a silyl group $SiR^8{}_2R^9$.

12. A curable composition according to claim 7, wherein $R^3$ of catalyst compound (B) is a fluoroaromatic ligand selected from the group consisting of aromatic carbocyclic and heterocyclic ring systems substituted at an ortho position relative to the metal-carbon bond with a fluorine atom, represented by the formula

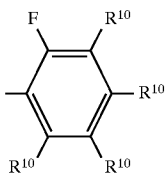

wherein each $R^{10}$ independently is a group selected from the group consisting of a hydrogen atom, a halogen atom, an alkyl group having 1 to 18 carbon atoms, a haloalkyl group having 1 to 18 carbon atoms, an unsaturated hydrocarbon, a silyl group $SiR^8{}_2R^9$, an aromatic ring optionally substituted with a halogen atom, a hetero-aromatic ring optionally substituted with a halogen atom, an alkyl group having 1 to 18 carbon atoms, an alkenyl group and a silyl group $SiR^8{}_2R^9$ and wherein at least two of the $R^{10}$ groups form at least one cyclic link back to the fluoroaromatic $C_6$ ring, thus forming with the fluoroaromatic $C_6$ ring a fluoroaromatic ligand selected from the group consisting of a fused aromatic carbocyclic ring, a fused aromatic polycyclic ring, a fused polyaromatic ring, and any of the fused rings recited above substituted with an alkyl group having 1 to 8 carbon atoms.

13. A curable composition according to claim 11, wherein $R^3$ is a pentafluorophenyl ligand.

14. A curable composition according to claim 12, wherein $R^3$ is a pentafluorophenyl ligand.

15. A curable composition according to claim 1, wherein in component (B) group $R^4$ is selected from the group consisting $R^3$, an alkyl group having 1 to 18 carbon atoms, an alkoxy group having 1 to 18 carbon atoms, an alkenyl group having 1 to 18 carbon atoms, an alkoxy alkoxy group, a halogen atom, an aryl group, a halo substituted aryl group, a monovalent organosilicon group and an organosiloxane group.

16. A curable composition according to claim 1, wherein catalyst compound (B) is a titanocene analogue wherein the fluoroaromatic ligand of $R^3$ is an ortho disubstituted fluorophenyl ligand and $R^4$ is $R^3$.

17. A curable composition according to claim 1, wherein $R^3$ and $R^4$ together represent a bidentate ligand

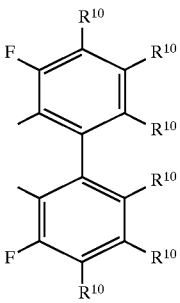

wherein each $R^{10}$ independently is a group selected from the group consisting of a hydrogen atom, a halogen atom, an alkyl group having 1 to 18 carbon atoms, a haloalkyl group having 1 to 18 carbon atoms, an unsaturated hydrocarbon, a silyl group $SiR^8{}_2R^9$, an aromatic ring optionally substituted with a halogen atom, a hetero-aromatic ring optionally substituted with a halogen atom, an alkyl group having 1 to 18 carbon atoms, an alkenyl group and a silyl group $SiR^8$ 2R, and wherein $R^8$ is an alkyl group having up to 18 carbon atoms and $R^9$ is selected from the group consisting of $R^8$, unsaturated monovalent hydrocarbon and hydro-carbon groups substituted by organosiloxane groups.

18. A curable composition according to claim 1, further comprising (C) an organo-silicon compound having two groups per molecule selected from the group consisting of silicon-bonded hydroxyl and alkoxy groups.

19. A curable composition according to claim 18, wherein Component (C) is selected from the group consisting of an organopolysiloxane and an organosilicon-organic copolymer, the organic component of which is selected from the group consisting of polyolefin, polyester, polyamide and polyether.

20. A curable composition according to claim 18, wherein component (C) is a silanol terminated polydiorganosiloxane having the general formula $HO-SiR^5{}_2[OSiR^5{}_2]_r-OH$, wherein $R^5$ is a monovalent group which does not inhibit or compete with a condensation reaction of component (C) and r has a value of from 1 to 1000.

21. A curable composition according to claim 1, wherein the catalyst component (B) is present in an amount of from 0.1 parts to 10 parts by weight per 100 parts by weight of the organosilicon compound (A).

22. A curable composition according to claim 18, wherein the catalyst component (B) is present in an amount of from 0.1 parts to 10 parts by weight per 100 parts by weight of the organosilicon compounds (A) and (C) together.

23. A method of curing a curable composition, comprising the step of exposing a curable composition to light of wavelength 350 nm to 500 nm in the presence of moisture, said curable composition comprising (A) an organosilicon compound having in each molecule at least one silicon-bonded alkoxy group and on average at least three groups selected from the group consisting of hydroxyl and alkoxy groups each bonded to a silicon atom; and (B) a catalyst component according to the formula

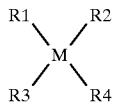

wherein $R^1$ and $R^2$ independently is a pentahapto ligand, $R^3$ is a fluoroaromatic ligand having a fluorine atom bonded in the ortho position relative to the M-ligand bond, $R^4$ is a group selected from the group consisting of $R^3$, monovalent alkyl, alkenyl, alkoxy, alkoxy alkoxy, halogen, aryl, halo substituted aryl, organosilicon and organosiloxane groups, and M is an atom selected from the group consisting of Ti, Zr and Hf.

* * * * *